(12) United States Patent
Matsumoto (10) Patent No.: US 9,438,238 B2
(45) Date of Patent: Sep. 6, 2016

(54) DATA PROCESSING APPARATUS, DATA PROCESSING METHOD, AND NON-TRANSITORY COMPUTER READABLE MEDIUM HAVING RECONFIGURATION INHIBITING FUNCTION

(71) Applicant: FUJI XEROX CO., LTD., Tokyo (JP)

(72) Inventor: Daisuke Matsumoto, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 142 days.

(21) Appl. No.: 14/287,857

(22) Filed: May 27, 2014

(65) Prior Publication Data

US 2015/0052344 A1    Feb. 19, 2015

(30) Foreign Application Priority Data

Aug. 16, 2013   (JP) ................................ 2013-169250

(51) Int. Cl.
```
G06F 9/00       (2006.01)
G06F 15/00      (2006.01)
H03K 19/0175    (2006.01)
G11C 29/44      (2006.01)
```

(52) U.S. Cl.
CPC ........... *H03K 19/017581* (2013.01); *G11C 2029/4402* (2013.01)

(58) Field of Classification Search
CPC .................................................. G06F 9/4411
USPC .......................................................... 713/100
See application file for complete search history.

(56) References Cited

U.S. PATENT DOCUMENTS

| | | | |
|---|---|---|---|
| 6,901,502 B2 * | 5/2005 | Yano et al. | 712/37 |
| 7,340,509 B2 * | 3/2008 | Daum et al. | 709/220 |
| 7,822,945 B2 * | 10/2010 | Hayashi | 712/34 |
| 8,291,360 B2 * | 10/2012 | Higuchi et al. | 716/104 |
| 8,495,339 B2 * | 7/2013 | Yamamoto | 712/15 |
| 8,719,550 B2 * | 5/2014 | Naito et al. | 712/15 |
| 2005/0272197 A1 * | 12/2005 | Tanaka | 438/222 |
| 2007/0174605 A1 * | 7/2007 | Kamiya et al. | 713/100 |
| 2007/0186218 A1 | 8/2007 | Hayashi | |

FOREIGN PATENT DOCUMENTS

JP    A-2007-207136    8/2007

* cited by examiner

*Primary Examiner* — Suresh Suryawanshi
(74) *Attorney, Agent, or Firm* — Oliff PLC (57) ABSTRACT

Provided is a data processing apparatus including a reconfigurable circuit that has a dynamically-reconfigurable circuit configuration to execute data processing with the reconfigured circuit configuration, a loading processor that loads reconfiguration data to a reconfiguration memory based on set loading information, a reconfiguration processor that reconfigures the circuit configuration with the reconfiguration data loaded to the reconfiguration memory in response to a request from the reconfigurable circuit, and a controller that executes a process of setting the loading information with respect to the loading processor while inhibiting the reconfiguration by invalidating the request, and validates the request after terminating the setting process to permit the reconfiguration.

11 Claims, 10 Drawing Sheets

EXAMPLE OF SETTING STATE OF SELF REGISTER SR
(SELF REGISTER × 8/RECONFIGURATION MEMORY × 3)

SELF REGISTER SR#0 ··· SETTING IS POSSIBLE
SELF REGISTER SR#1 ··· SETTING IS POSSIBLE
SELF REGISTER SR#2 ··· SETTING IS POSSIBLE
SELF REGISTER SR#3 ··· BEING EXECUTED (BEING EXECUTED IN RECONFIGURATION MEMORY)
SELF REGISTER SR#4 ··· SETTING COMPLETED (BEING LOADED TO RECONFIGURATION MEMORY)
SELF REGISTER SR#5 ··· SETTING COMPLETED (BEING LOADED TO RECONFIGURATION MEMORY)
SELF REGISTER SR#6 ··· SETTING IS POSSIBLE
SELF REGISTER SR#7 ··· SETTING IS POSSIBLE

FIG. 8

DATA PROCESSING APPARATUS, DATA PROCESSING METHOD, AND NON-TRANSITORY COMPUTER READABLE MEDIUM HAVING RECONFIGURATION INHIBITING FUNCTION

CROSS-REFERENCE TO RELATED APPLICATIONS

This application is based on and claims priority under 35 USC 119 from Japanese Patent Application No. 2013-169250 filed Aug. 16, 2013.

BACKGROUND (i) Technical Field

The present invention relates to a data processing apparatus, a data processing method, and a non-transitory computer readable medium.

(ii) Related Art

In recent years, reconfigurable devices in which an internal circuit configuration may be dynamically reconfigured (dynamic reconfiguration devices) have been developed, and data processing apparatuses using a reconfigurable device have also been proposed.

SUMMARY

According to an aspect of the invention, there is provided a data processing apparatus including:

a reconfigurable circuit that has a dynamically-reconfigurable circuit configuration to execute data processing with the reconfigured circuit configuration;

a loading processor that loads reconfiguration data to a reconfiguration memory based on set loading information;

a reconfiguration processor that reconfigures the circuit configuration with the reconfiguration data loaded to the reconfiguration memory in response to a request from the reconfigurable circuit; and a controller that executes a process of setting the loading information with respect to the loading processor while inhibiting the reconfiguration by invalidating the request, and validates the request after terminating the setting process to permit the reconfiguration.

BRIEF DESCRIPTION OF THE DRAWINGS

Exemplary embodiments of the present invention will be described in detail based on the following figures, wherein.

DETAILED DESCRIPTION

Figure 1:
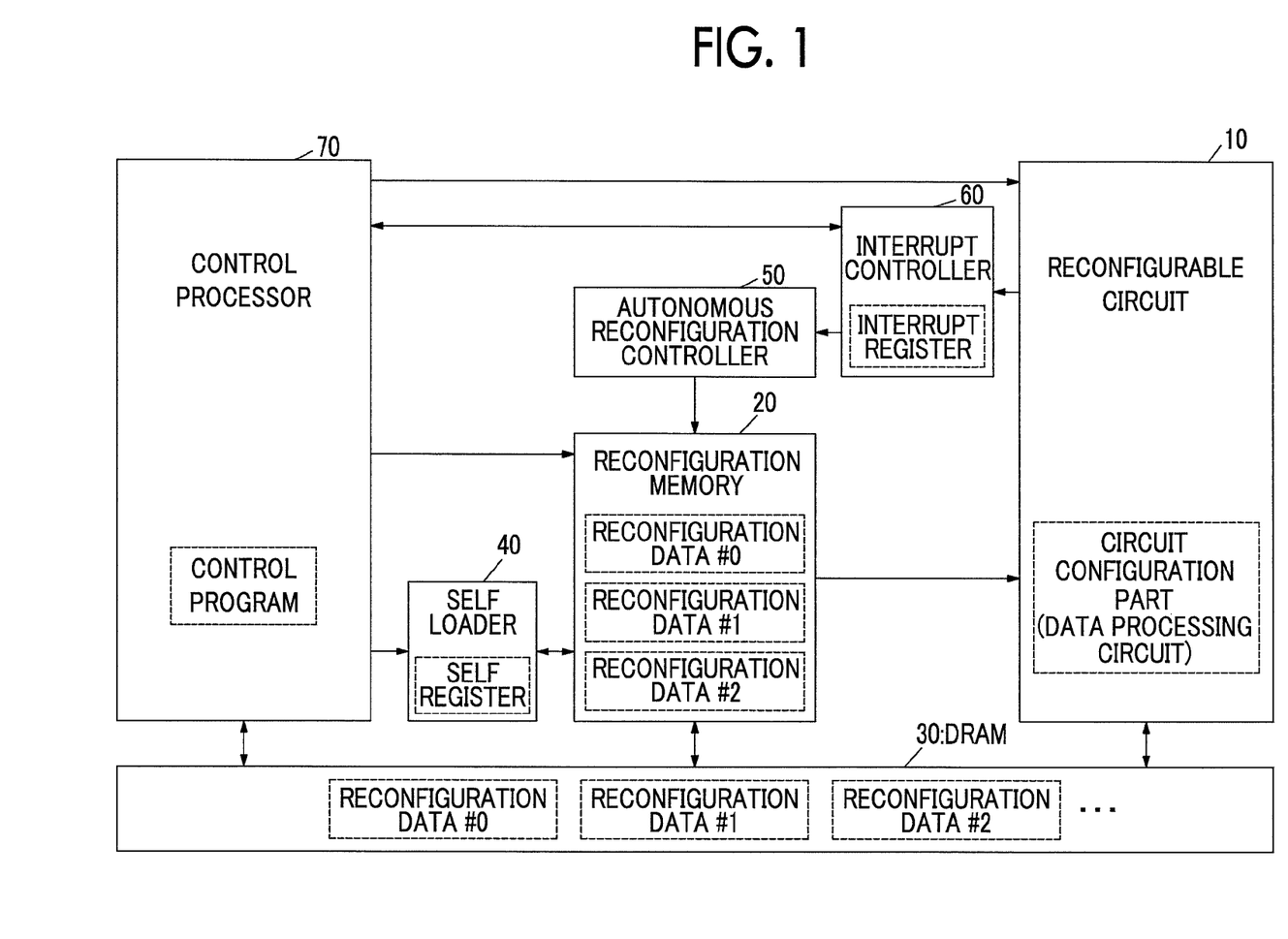
FIG. 1 is a diagram showing an appropriate data processing apparatus according to an exemplary embodiment of the invention.

FIG. 1 is a diagram showing a configuration of an appropriate data processing apparatus according to an exemplary embodiment of the invention. The data processing apparatus of FIG. 1 (the present data processing apparatus) is provided with a reconfigurable circuit 10, a reconfiguration memory 20, a DRAM 30, a self loader 40, an autonomous reconfiguration controller 50, an interrupt controller 60, and a control processor 70, and executes data processing necessary for processing target data.

The present data processing apparatus is realized by, for example, a dynamic reconfigurable processor (DRP) or the like. For example, when the present data processing apparatus is realized by DRP, FIG. 1 is a functional block diagram in the DRP.

The reconfigurable circuit 10 is a circuit in which an internal logic circuit configuration may be reconfigured dynamically, that is, during the operation of the circuit, and is provided with, for example, a circuit configuration part provided with many circuit elements (processor elements (PE)). The connection configuration between the circuit elements may be relatively rapidly reconfigured (recombined) according to reconfiguration data (configuration data), and the reconfigured circuit configuration part functions as a data processing circuit.

The circuit configuration part in the reconfigurable circuit 10 is reconfigured based on the reconfiguration data stored in the reconfiguration memory 20. The reconfiguration memory 20 may store one or more pieces of reconfiguration data. In the specific example shown in FIG. 1, three pieces of reconfiguration data are stored in the reconfiguration memory 20.

Many pieces of reconfiguration data used in the present data processing apparatus are stored in the DRAM 30, and the reconfiguration data stored in the DRAM 30 is loaded to the reconfiguration memory 20 by the self loader 40.

The self loader 40 is provided with a self register, and the reconfiguration data stored in the DRAM 30 is loaded to the reconfiguration memory 20 based on the information necessary for loading set in the self register (loading information).

The autonomous reconfiguration controller 50 reconfigures the circuit configuration part of the reconfigurable circuit 10 with the reconfiguration data loaded to the reconfiguration memory 20 in response to a request from the reconfigurable circuit 10, that is, an interrupt signal for requesting the reconfiguration. The interrupt signal output from the reconfigurable circuit 10 is sent to the autonomous reconfiguration controller 50 through the interrupt controller 60.

The control processor 70 performs intensive control in the present data processing apparatus. The control processor 70 is composed of, for example, hardware that realizes a calculation function and the like and software (control program) that regulates the operation of the hardware, and realizes control related to the present data processing apparatus with cooperation between the hardware and the software.

The function of the control processor 70 may be realized by a computer. In that case, a data processing program (control program) corresponding to the function of the control processor 70 is stored in a computer readable storage medium such as a disk and a memory, and is provided to a computer through the storage medium. The program may be provided to a computer through a telecommunication line such as the internet. In addition, the same function as the control processor 70 is realized with cooperation between a hardware resource such as a CPU and a memory of a computer and the provided program (software). Furthermore, the function may be partially or completely realized with a computer using, for example, a program corresponding to some or all of the functions of the self loader 40, the autonomous reconfiguration controller 50, and the interrupt controller 60.

Favorable specific examples of the data processed by the present data processing apparatus include image data. For example, image data is provided from an external apparatus such as a computer to the present data processing apparatus, and is sent to the reconfigurable circuit 10 through a device and the like (not shown). The present data processing apparatus may be assembled in an image processing apparatus having an image reading function (scan function) and the like to process, with the reconfigurable circuit 10, image data obtained from a medium such as paper through the function. An image corresponding to the image data after the process may be printed on paper or the like, or the image data after the process may be provided to an external apparatus.

The image data is just an appropriate specific example that may be processed in the present data processing apparatus, and it is obvious that the present data processing apparatus may process data other than the image data. For example, the present data processing apparatus may be equipped in an information processing apparatus, an information processing terminal, audio/visual equipment, an electric appliance, a vehicle, or the like so as to be used in various data processings, controls, and the like.

The outline of the present data processing apparatus is as described above. Next, a process and the like to be executed by the present data processing apparatus will be described in detail. Regarding the configuration (part) shown in FIG. 1, the reference numerals in FIG. 1 will be used in the following description.

Figure 2:
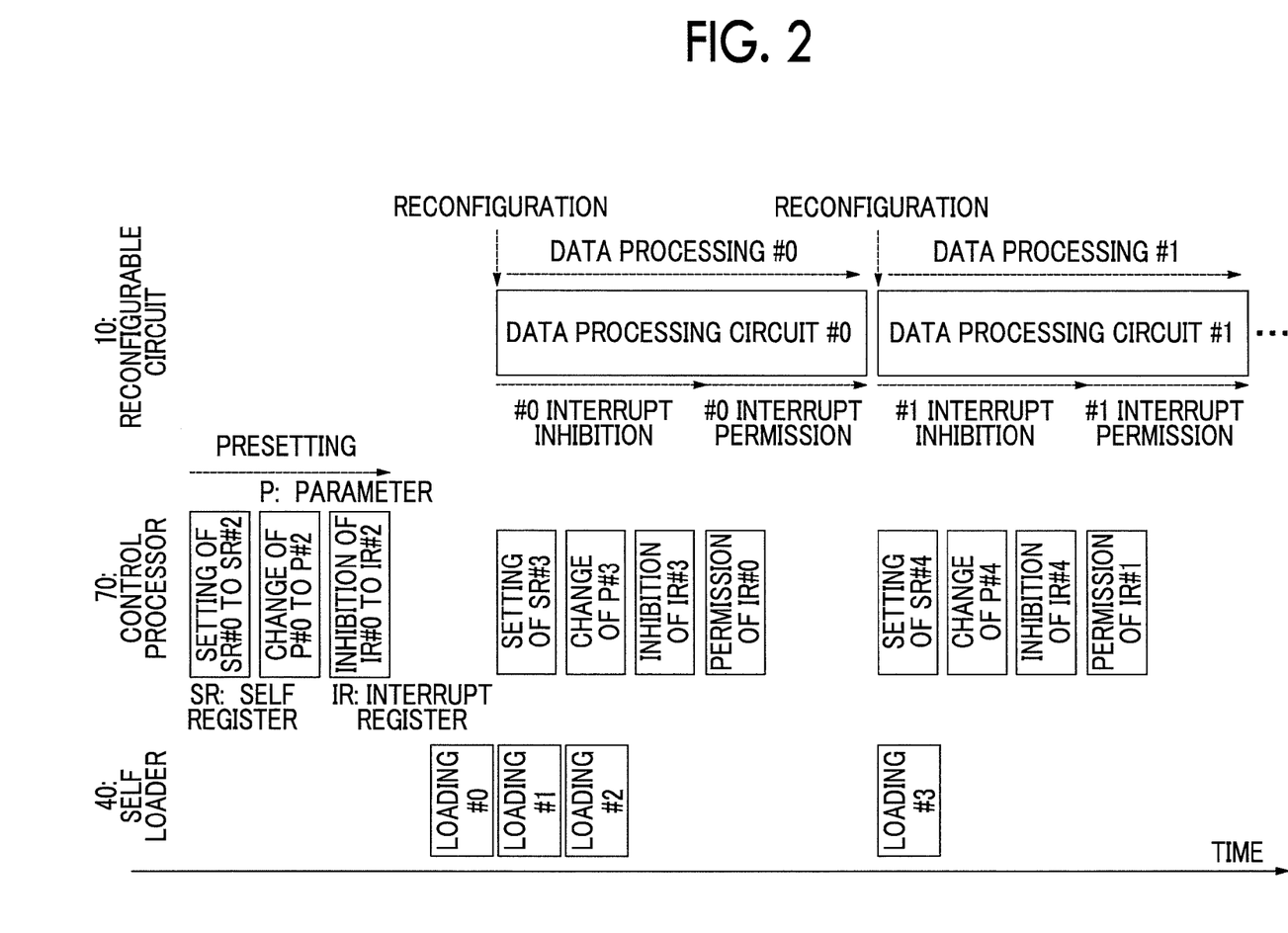
FIG. 2 is a schematic diagram of a process related to the reconfiguration in the data processing apparatus of FIG. 1.

FIG. 2 is a schematic diagram of a process related to the reconfiguration in the present data processing apparatus. The present data processing apparatus reconfigures a data processing circuit necessary for processing of data in the reconfigurable circuit 10, and processes the data using the reconfigured data processing circuit. The timing chart of FIG. 2 shows the outline of the process related to the reconfiguration in the present data processing apparatus.

In the timing chart shown in FIG. 2, first, the control processor 70 performs setting of a self register SR, change of a parameter P, and setting of an interrupt register IR as initial setting before start of data processing.

The self register SR is a register of the self loader 40, and information necessary for loading of reconfiguration data from the DRAM 30 to the reconfiguration memory 20 by the self loader 40 (loading information) is set in the self register SR. The self loader 40 is provided with, for example, eight self registers SR#0 to SR#7, and for each self register SR, loading information of reconfiguration data corresponding to the self register SR is set. The loading information of the reconfiguration data includes, for example, information such as an address of the reconfiguration data, a data size of the reconfiguration data, and a loading order of the reconfiguration data. In the specific example shown in FIG. 2, loading information is set in each of three self registers SR#0 to SR#2 among the eight self registers SR#0 to SR#7 in the initial setting.

The number of the self registers SR may not be eight. In addition, the number of the self registers SR to be initially set is also not limited to three. However, for example, the number of the self registers SR to be initially set is desirably the same as the number of pieces of reconfiguration data that may be loaded to the reconfiguration memory 20.

The parameter P is information related to processing target data of a data processing circuit that is realized by reconfiguration data. For example, an address of the processing target data, a size of the data, and the like are set as the parameter P. The parameter P is set for each reconfiguration data set in the self register SR. For example, in the initial setting, when loading information of reconfiguration data #0 to #2 is set in the respective self registers SR#0 to SR#2, parameters P#0 to P#2 corresponding to the respective pieces of reconfiguration data #0 to #2 are set.

The interrupt register IR is a register of the interrupt controller 60, and mask setting (interrupt inhibition) and mask release (interrupt permission) are registered in the interrupt register IR with respect to an interrupt signal output from the reconfigurable circuit 10. Mask registration is performed for each reconfiguration data set in the self register SR in the interrupt register IR. For example, in the initial setting, when loading information of reconfiguration data #0 to #2 is set in the respective self registers SR#0 to SR#2, mask setting (interrupt inhibition) is set with respect to interrupt registers IR#0 to IR#2 corresponding to the respective pieces of reconfiguration data #0 to #2. Accordingly, the reconfiguration from the circuit configuration corresponding to the respective pieces of reconfiguration data #0 to #2 to the next circuit configuration is temporarily inhibited.

In the initial setting, when completing the setting of the self register SR, the change of the parameter P, and the setting of the interrupt register IR, the control processor 70 issues an instruction to start the execution of data processing by the reconfigurable circuit 10.

When an instruction is issued to start the execution of data processing, the self loader 40 loads reconfiguration data from the DRAM 30 to the reconfiguration memory 20 in accordance with the loading information set in the self register SR. In the specific example shown in FIG. 2, in the initial setting, since the loading information is set in the three self registers SR#0 to SR#2, the self loader 40 executes loading #0 to #2 in accordance with the respective pieces of loading information in order of the self registers SR#0 to SR#2, and thus three pieces of reconfiguration data #0 to #2 are sequentially loaded to the reconfiguration memory 20. When loading information, of which the number is the same as the number of pieces of reconfiguration data that may be loaded to the reconfiguration memory 20, is initially set in the self register SR, the self loader 40 may sequentially load, to the reconfiguration memory 20, all of the pieces of reconfiguration data initially set.

When the loading #0 is executed by the self loader 40 and the reconfiguration data #0 is loaded to the reconfiguration memory 20, the circuit configuration part of the reconfigurable circuit 10 is reconfigured as a data processing circuit #0 of the reconfiguration data #0, and the data processing circuit #0 executes data processing #0.

When the data processing #0 by the data processing circuit #0 is terminated, the reconfigurable circuit 10 outputs an interrupt signal requesting the reconfiguration. The interrupt signal output from the reconfigurable circuit 10 is sent to the autonomous reconfiguration controller 50 through the interrupt controller 60. However, in the initial setting, since the interrupt register IR#0 corresponding to the reconfiguration data #0 is subjected to mask setting (interrupt inhibition), the interrupt signal associated with the termination of the data processing #0 corresponding to the reconfiguration data #0 is subjected to mask processing, and thus the interrupt signal is not sent to the autonomous reconfiguration controller 50, and the reconfiguration is temporarily inhibited.

The control processor 70 performs setting of the self register SR, change of the parameter P, and setting of the interrupt register IR in a period in which the interrupt associated with the termination of the data processing #0 is inhibited, that is, a #0 interrupt inhibition period shown in FIG. 2.

That is, with respect to reconfiguration data #3 following the reconfiguration data #0 to #2 set previously in the initial setting, the control processor 70 sets loading information of the reconfiguration data #3 in the self register SR#3, sets a parameter P#3 of the reconfiguration data #3, and registers mask setting (interrupt inhibition) of the reconfiguration data #3 in an interrupt register IR#3.

When the setting of the self register SR, the change of the parameter P, and the setting of the interrupt register IR related to the reconfiguration data #3 are terminated, the control processor 70 releases the mask of the interrupt register IR#0 related to the reconfiguration data #0. Accordingly, the mask of the interrupt signal associated with the termination of the data processing #0 corresponding to the reconfiguration data #0 is released.

After the release of the mask of the interrupt signal associated with the termination of the data processing #0, when an interrupt signal is output from the reconfigurable circuit 10, that is, when an interrupt signal requesting the reconfiguration is output from the reconfigurable circuit 10 in a #0 interrupt permission period shown in FIG. 2, the interrupt signal is sent to the autonomous reconfiguration controller 50 through the interrupt controller 60.

When the interrupt signal is sent, the autonomous reconfiguration controller 50 reconfigures the circuit configuration part of the reconfigurable circuit 10 with the reconfiguration data #1 loaded to the reconfiguration memory 20 in response to the request from the reconfigurable circuit 10. Accordingly, the circuit configuration part of the reconfigurable circuit 10 is reconfigured as a data processing circuit #1 corresponding to the reconfiguration data #1, and the data processing circuit #1 executes data processing #1.

In addition, when the circuit configuration part of the reconfigurable circuit 10 is reconfigured as the data processing circuit #1, the self loader 40 loads the reconfiguration data #3 from the DRAM 30 to a region where the reconfiguration data #0 of the reconfiguration memory 20 has been stored, that is, a region that may be set in association with the termination of the data processing #0.

Although the circuit configuration part of the reconfigurable circuit 10 is reconfigured as the data processing circuit #1 and the data processing circuit #1 executes the data processing #1, the interrupt register IR#1 corresponding to the reconfiguration data #1 is subjected to mask setting (interrupt inhibition) in the initial setting. Accordingly, the interrupt signal associated with the termination of the data processing #1 corresponding to the reconfiguration data #1 is subjected to mask processing, and thus the interrupt signal is not sent to the autonomous reconfiguration controller 50, and the reconfiguration is temporarily inhibited.

The control processor 70 performs setting of the self register SR, change of the parameter P, and setting of the interrupt register IR in a period in which the interrupt associated with the termination of the data processing #1 is inhibited, that is, a #1 interrupt inhibition period shown in FIG. 2.

That is, with respect to reconfiguration data #4 following the reconfiguration data #3 set previously, the control processor 70 sets loading information of the reconfiguration data #4 in the self register SR#4, sets a parameter P#4 of the reconfiguration data #4, and registers mask setting (interrupt inhibition) of the reconfiguration data #4 in an interrupt register IR#4.

When the setting of the self register SR, the change of the parameter P, and the setting of the interrupt register IR related to the reconfiguration data #4 are terminated, the control processor 70 releases the mask of the interrupt register IR#1 related to the reconfiguration data #1. Accordingly, the mask of the interrupt signal associated with the termination of the data processing #1 corresponding to the reconfiguration data #1 is released.

After the release of the mask of the interrupt signal associated with the termination of the data processing #1, when an interrupt signal is output from the reconfigurable circuit 10, that is, when an interrupt signal requesting the reconfiguration is output from the reconfigurable circuit 10 in a #1 interrupt permission period shown in FIG. 2, the interrupt signal is sent to the autonomous reconfiguration controller 50 through the interrupt controller 60. When the interrupt signal is sent, the autonomous reconfiguration controller 50 reconfigures the circuit configuration part of the reconfigurable circuit 10 in response to the request from the reconfigurable circuit 10.

Although omitted in the drawing, data processings #2, #3, #4, etc. corresponding to the reconfiguration data #2, #3, #4, etc., respectively, are sequentially executed after the data processing #1. In addition, an interrupt signal associated with the termination of each data processing is subjected to mask setting to inhibit the reconfiguration, and the control processor 70 performs setting of the self register SR, change of the parameter P, and setting of the interrupt register IR during the execution of each data processing.

Figure 3:
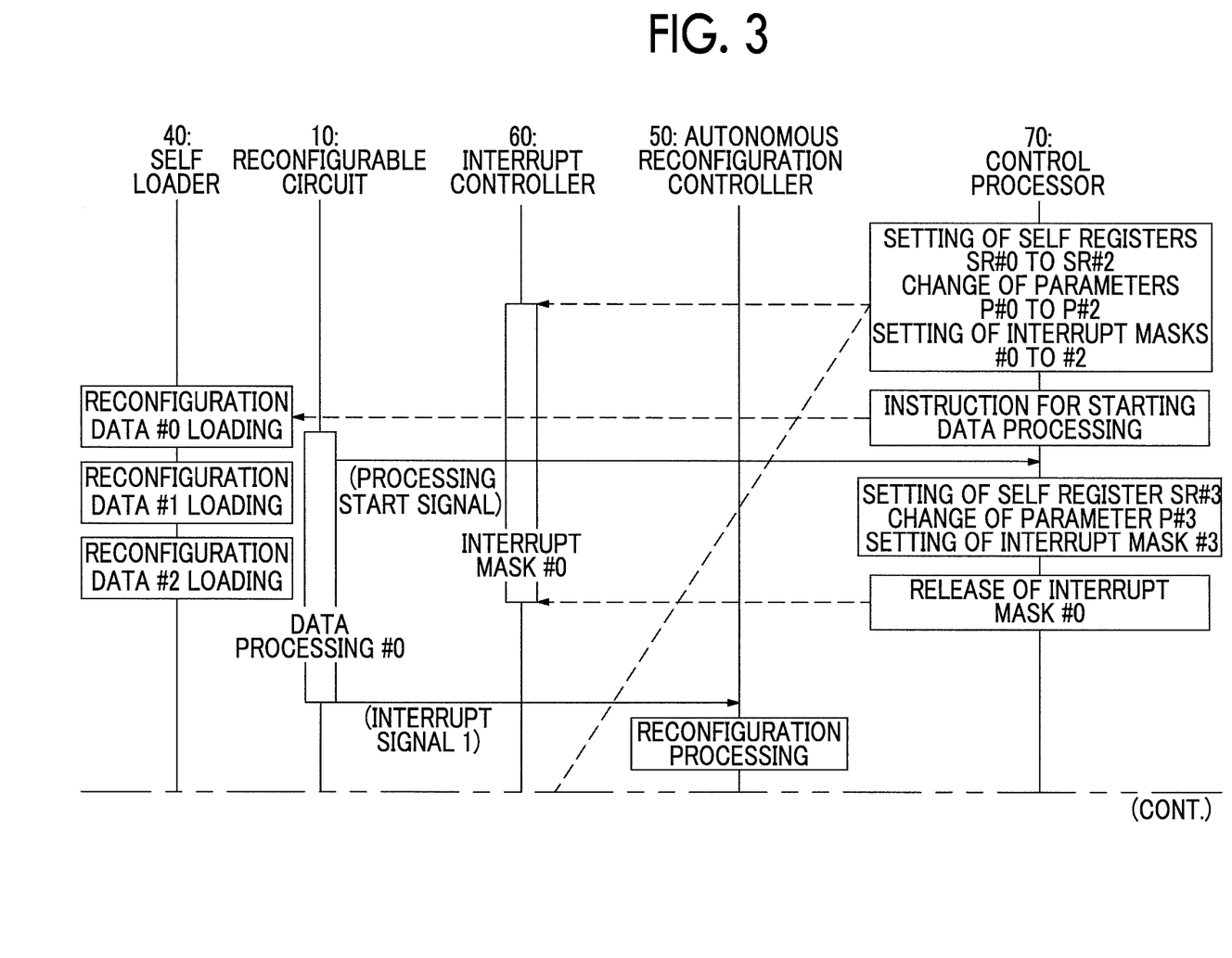
FIG. 3 is a timing chart of the reconfiguration by the data processing apparatus of FIG. 1.

FIG. 3 is a timing chart of the reconfiguration (dynamic autonomous reconfiguration) by the present data processing apparatus. First, the control processor 70 performs setting of the self registers SR#0 to SR#2, change of the parameters P#0 to P#2, and setting of the interrupt registers IR#0 to IR#2 as initial setting before start of data processing. In the setting of the interrupt registers IR#0 to IR#2, interrupt mask (#0 to #2) setting is performed for each of the registers (IR#0 to IR#2). When the initial setting is terminated, the control processor 70 issues an instruction to start the data processing.

When the instruction is issued to start the data processing, the self loader 40 loads reconfiguration data #0 to #2 in this order from the DRAM 30 to the reconfiguration memory 20, based on the loading information set in each of the self registers SR#0 to SR#2.

When the reconfiguration data #0 is loaded to the reconfiguration memory 20, the circuit configuration part of the reconfigurable circuit 10 is reconfigured as the data processing circuit #0 corresponding to the reconfiguration data #0, and the data processing circuit #0 executes the data processing #0. When the data processing #0 is started, the reconfigurable circuit 10 outputs a processing start signal indicating the start. The processing start signal is sent to the control processor 70 through the interrupt controller 60.

The control processor 70 receiving the processing start signal sets information related to the reconfiguration data #3 following the reconfiguration data #0 to #2 set previously in the initial setting. That is, the control processor 70 sets loading information of the reconfiguration data #3 in the self register SR#3, sets a parameter P#3 of the reconfiguration data #3, and sets an interrupt mask #3 in the interrupt register IR#3. When the setting of the information related to the reconfiguration data #3 is terminated, the control processor 70 releases the interrupt mask #0 of the interrupt register IR#0.

When the data processing #0 is terminated, the reconfigurable circuit 10 outputs, to the interrupt controller 60, an interrupt signal indicating the termination. The interrupt controller 60 subjects the interrupt signal to mask processing so that the interrupt signal of the data processing #0 is not output to the autonomous reconfiguration controller 50 in a period in which the interrupt mask #0 corresponding to the data processing #0 is set. When the interrupt mask #0 corresponding to the data processing #0 is released, the interrupt controller 60 outputs the interrupt signal of the data processing #0 to the autonomous reconfiguration controller 50.

In the specific example shown in FIG. 3, since the interrupt mask #0 is released at the time when the reconfigurable circuit 10 outputs an interrupt signal 1 of the data processing #0, the interrupt signal 1 is sent from the interrupt controller 60 to the autonomous reconfiguration controller 50 without being subjected to mask processing.

The autonomous reconfiguration controller 50 receiving the interrupt signal 1 of the data processing #0 reconfigures the circuit configuration part of the reconfigurable circuit 10 as the data processing circuit #1 corresponding to the reconfiguration data #1 with the reconfiguration data #1 loaded to the reconfiguration memory 20. The reconfigured data processing circuit #1 executes data processing #1. When the data processing #1 is started, the reconfigurable circuit 10 outputs a processing start signal indicating the start. The processing start signal is sent to the control processor 70 through the interrupt controller 60.

The control processor 70 receiving the processing start signal sets information related to the reconfiguration data #4 following the reconfiguration data #3 set previously. That is, the control processor 70 sets loading information of the reconfiguration data #4 in the self register SR#4, sets a parameter P#4 of the reconfiguration data #4, and sets an interrupt mask #4 in the interrupt register IR#4. When the setting of the information related to the reconfiguration data #4 is terminated, the control processor 70 releases the interrupt mask #1 of the interrupt register IR#1.

When the data processing #1 is terminated, the reconfigurable circuit 10 outputs, to the interrupt controller 60, an interrupt signal indicating the termination. The interrupt controller 60 subjects the interrupt signal to mask processing so that the interrupt signal of the data processing #1 is not output to the autonomous reconfiguration controller 50 in a period in which the interrupt mask #1 corresponding to the data processing #1 is set. When the interrupt mask #1 corresponding to the data processing #1 is released, the interrupt controller 60 outputs the interrupt signal of the data processing #1 to the autonomous reconfiguration controller 50.

In the specific example shown in FIG. 3, since the interrupt mask #1 is set at the time when the reconfigurable circuit 10 outputs a first interrupt signal 1 and a second interrupt signal 2 related to the data processing #1, the interrupt signal 1 and the interrupt signal 2 are subjected to mask processing. At the time when a third interrupt signal 3 related to the data processing #1 is output, the interrupt mask #1 is released, and thus the interrupt signal 3 is sent from the interrupt controller 60 to the autonomous reconfiguration controller 50 without being subjected to mask processing.

Although omitted in FIG. 3, the reconfiguration and data processing based on data subsequent to the reconfiguration data #2 are sequentially executed.

According to the process shown in FIG. 3, for example, in a period in which the control processor 70 executes setting of the self register SR of the self loader 40 and change of the parameter P, the interrupt signal from the reconfigurable circuit 10 is subjected to mask processing, and thus the reconfiguration during the setting of the self register SR and the change of the parameter P is avoided. Therefore, for example, in the execution of plural data processings, during the execution of each data processing, the setting of the self register SR and the change of the parameter P related to the next data processing may be performed. Accordingly, for example, in the initial setting before the execution of plural data processings, a change in the order of the data processings, the change of the parameter P, and the like are dealt with flexibly, compared to a case in which the setting of the self register SR and the change of the parameter P are performed in relation to all of the data processings.

In addition, according to the process shown in FIG. 3, for example, even when the number of the self registers SR is limited (for example, to eight), self registers SR that may be reset after the use of the loading information may be cyclically used. Therefore, the reconfiguration may be continued plural times (without limitation in theory) without being limited by the number of the self registers SR.

Figure 4:
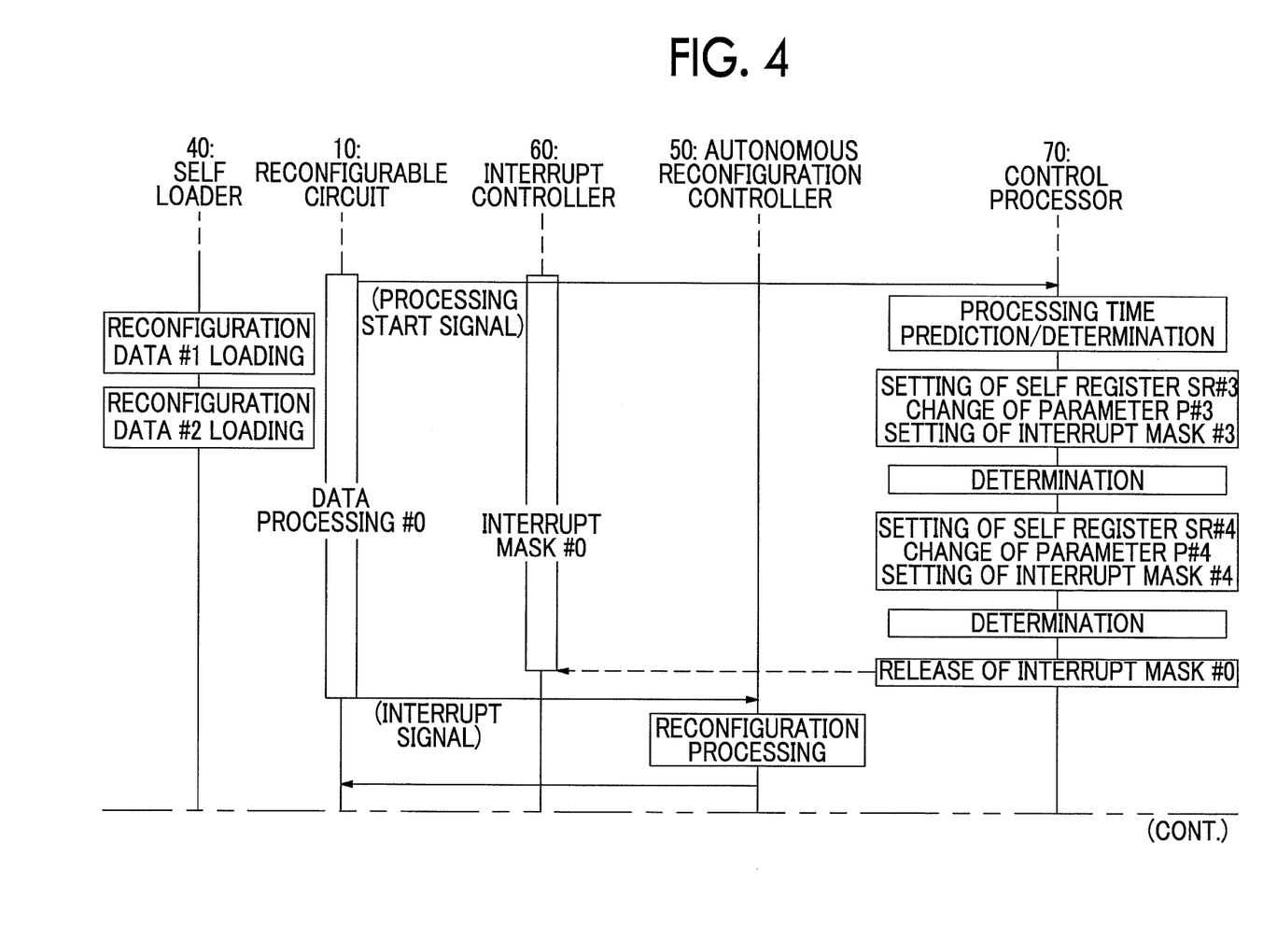
FIG. 4 is a timing chart showing a process having scheduling of the reconfiguration by the data processing apparatus of FIG. 1.

FIG. 4 is a timing chart showing a process having scheduling of the reconfiguration by the present data processing apparatus. As described above using FIG. 3, the control processor 70 performs setting of the self registers SR#0 to SR#2, change of the parameters P#0 to P#2, and setting of the interrupt registers IR#0 to IR#2 as initial setting before start of data processing. When the initial setting is terminated, the control processor 70 issues an instruction to start the data processing. The timing chart of FIG. 4 shows a process after the control processor 70 issues an instruction to start the data processing.

When the instruction is issued to start the data processing, the self loader 40 loads reconfiguration data #0 to #2 in this order from the DRAM 30 to the reconfiguration memory 20, based on the loading information set in each of the self registers SR#0 to SR#2.

When the reconfiguration data #0 is loaded to the reconfiguration memory 20, the circuit configuration part of the reconfigurable circuit 10 is reconfigured as the data processing circuit #0 corresponding to the reconfiguration data #0, and the data processing circuit #0 executes the data processing #0. When the data processing #0 is started, the reconfigurable circuit 10 outputs a processing start signal indicating the start. The processing start signal is sent to the control processor 70 through the interrupt controller 60.

The control processor 70 receiving the processing start signal related to the data processing #0 predicts a processing time of the data processing #0, and determines whether the completion of the setting of information related to reconfiguration data #3 is possible within the processing time. When determining that the completion of the setting is possible, the control processor 70 sets loading information of the reconfiguration data #3 in the self register SR#3, sets a parameter P#3 of the reconfiguration data #3, and sets an interrupt mask #3 in the interrupt register IR#3.

When the setting of the information related to the reconfiguration data #3 is terminated, the control processor 70 determines whether the completion of the setting of information related to reconfiguration data #4 is possible within the processing time of the data processing #0. When determining that the completion of the setting is possible, the control processor 70 sets loading information of the reconfiguration data #4 in the self register SR#4, sets a parameter P#4 of the reconfiguration data #4, and sets an interrupt mask #4 in the interrupt register IR#4.

When the setting of the information related to the reconfiguration data #4 is terminated, the control processor 70 determines whether the completion of the setting of information related to reconfiguration data #5 is possible within the processing time of the data processing #0. When determining that the completion of the setting is not possible, the control processor 70 does not set the information related to the reconfiguration data #5, but temporarily terminates the setting process to release the interrupt mask #0 of the interrupt register IR#0.

In the process shown in FIG. 4, when it is determined that the completion of the setting of information related to reconfiguration data is possible within the processing time of the data processing, the information related to the reconfiguration data is set (setting of the self register SR and the like), and thus the setting may be completed within the processing time of the data processing. In addition, when it is determined that the setting is possible within the processing time of the data processing, information related to plural pieces of reconfiguration data (for example, self registers SR#3, SR#4, and the like) may be set.

When the data processing #0 is terminated, the reconfigurable circuit 10 outputs, to the interrupt controller 60, an interrupt signal indicating the termination. The interrupt controller 60 subjects the interrupt signal to mask processing so that the interrupt signal of the data processing #0 is not output to the autonomous reconfiguration controller 50 in a period in which the interrupt mask #0 corresponding to the data processing #0 is set. When the interrupt mask #0 corresponding to the data processing #0 is released, the interrupt controller 60 outputs the interrupt signal of the data processing #0 to the autonomous reconfiguration controller 50.

In the specific example shown in FIG. 4, since the interrupt mask #0 is released at the time when the reconfigurable circuit 10 outputs the interrupt signal of the data processing #0, the interrupt signal is sent from the interrupt controller 60 to the autonomous reconfiguration controller 50 without being subjected to mask processing.

The autonomous reconfiguration controller 50 receiving the interrupt signal of the data processing #0 reconfigures the circuit configuration part of the reconfigurable circuit 10 as the data processing circuit #1 corresponding to the reconfiguration data #1 with the reconfiguration data #1 loaded to the reconfiguration memory 20. Then, the reconfigured data processing circuit #1 executes data processing #1. When the data processing #1 is started, the reconfigurable circuit 10 outputs a processing start signal indicating the start. The processing start signal is sent to the control processor 70 through the interrupt controller 60.

The control processor 70 receiving the processing start signal related to the data processing #1 predicts a processing time of the data processing #1, and determines whether the completion of the setting of the information related to the reconfiguration data #5 is possible within the processing time. When determining that the completion of the setting is not possible, the control processor 70 does not set the information related to the reconfiguration data #5, but temporarily terminates the setting process to release the interrupt mask #1 of the interrupt register IR#1.

When the data processing #1 is terminated, the reconfigurable circuit 10 outputs, to the interrupt controller 60, an interrupt signal indicating the termination. In the specific example shown in FIG. 4, since the interrupt mask #1 is released at the time when the reconfigurable circuit 10 outputs the interrupt signal of the data processing #1, the interrupt signal is sent from the interrupt controller 60 to the autonomous reconfiguration controller 50 without being subjected to mask processing, and the next reconfiguration is immediately executed.

In the process shown in FIG. 4, when it is determined that the completion of the setting of loading information and the like related to reconfiguration data is not possible within the processing time of the data processing, the setting related to the reconfiguration data is not performed, and the setting process is temporarily terminated to release the interrupt mask so that the reconfiguration is permitted. Therefore, the standby time of the reconfigurable circuit 10 that is generated due to the inhibition of the reconfiguration is shortened, compared to a case in which the loading information and the like are set regardless of the fact that the setting of the loading information and the like may not be completed within the processing time of the data processing.

Figure 5:
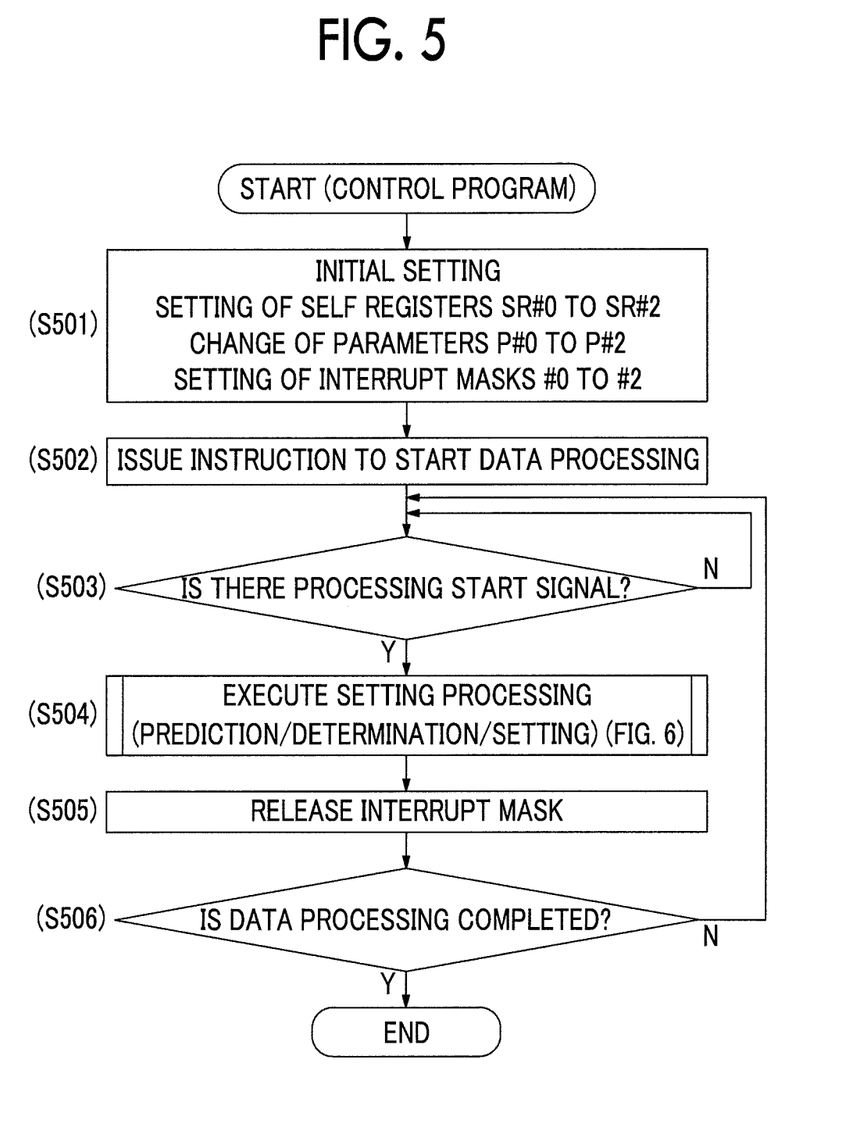
FIG. 5 is a flowchart showing a control process executed by a control processor.

FIG. 5 is a flowchart showing the control process executed by the control processor 70 (the process realized by a control program). The control processor 70 is composed of, for example, hardware that realizes a calculation function and the like and software (control program) that regulates the operation of the hardware, and executes the control process shown in the flowchart of FIG. 5 with cooperation between the hardware and the software. Hereinafter, processes in the respective steps in the flowchart of FIG. 5 will be described.

The control processor 70 performs setting of the self registers SR#0 to SR#2, change of the parameters P#0 to P#2, and setting of the interrupt masks #0 to #2 as initial setting (S501). When the initial setting is terminated, the control processor 70 issues an instruction to start data processing (S502).

When the instruction is issued to start the data processing, the self loader 40 loads reconfiguration data, and the circuit configuration part of the reconfigurable circuit 10 is reconfigured to start the data processing. When the data processing started, the reconfigurable circuit 10 outputs a processing start signal indicating the start (see FIGS. 3 and 4).

When the output of the processing start signal is confirmed (S503), the control processor 70 executes a setting process related to the reconfiguration data (S504).

Figure 6:
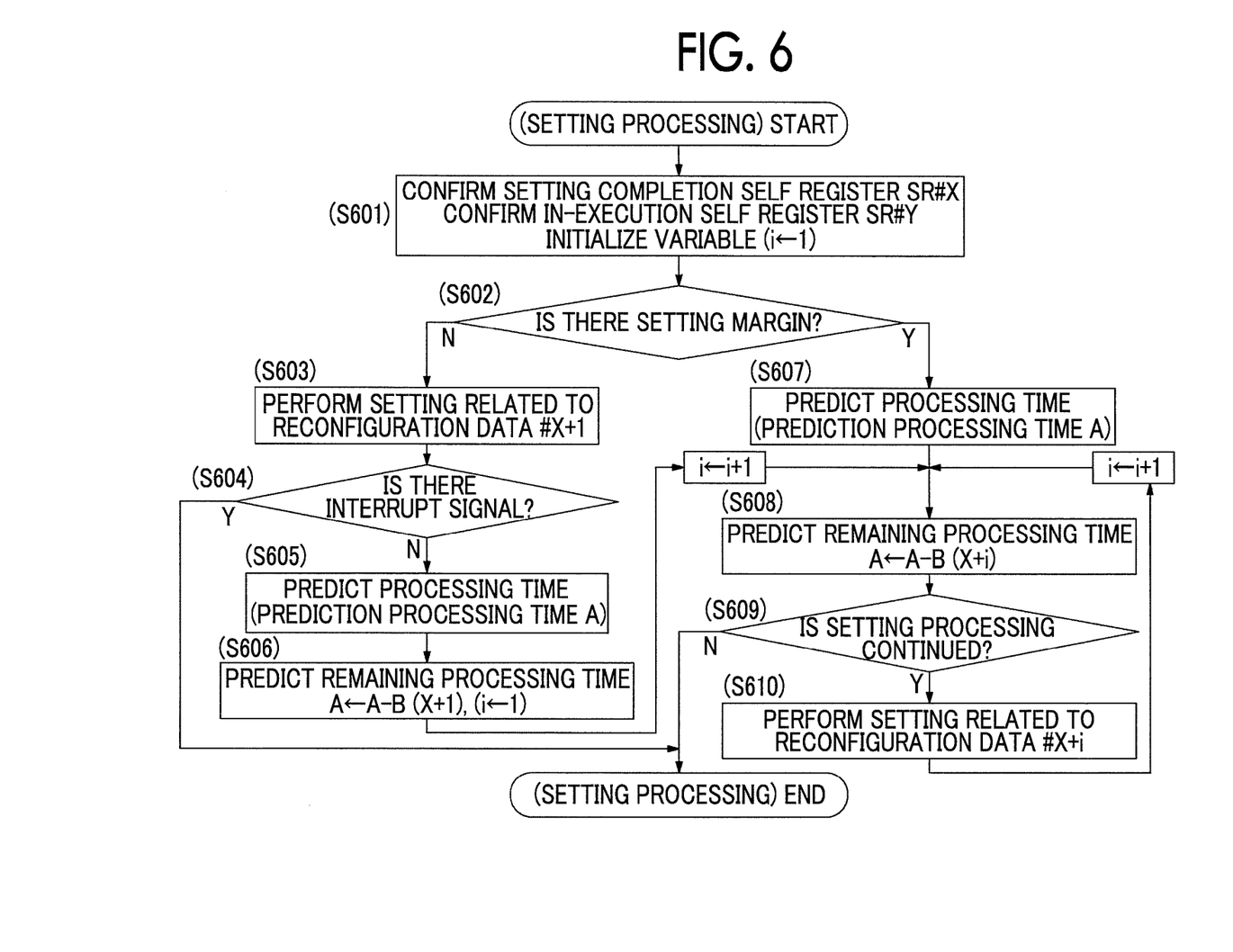
FIG. 6 is a flowchart showing a setting process executed by the control processor.

FIG. 6 is a flowchart showing the setting process (process in S504 of FIG. 5) executed by the control processor 70.

In the setting process, first, the control processor 70 confirms a setting state of the self register SR (S601). That is, the control processor 70 confirms a number (#X) of a self register SR in which the setting is completed and a number (#Y) of a self register SR that is currently being executed, and initializes a variable i to 1.

Figure 7:
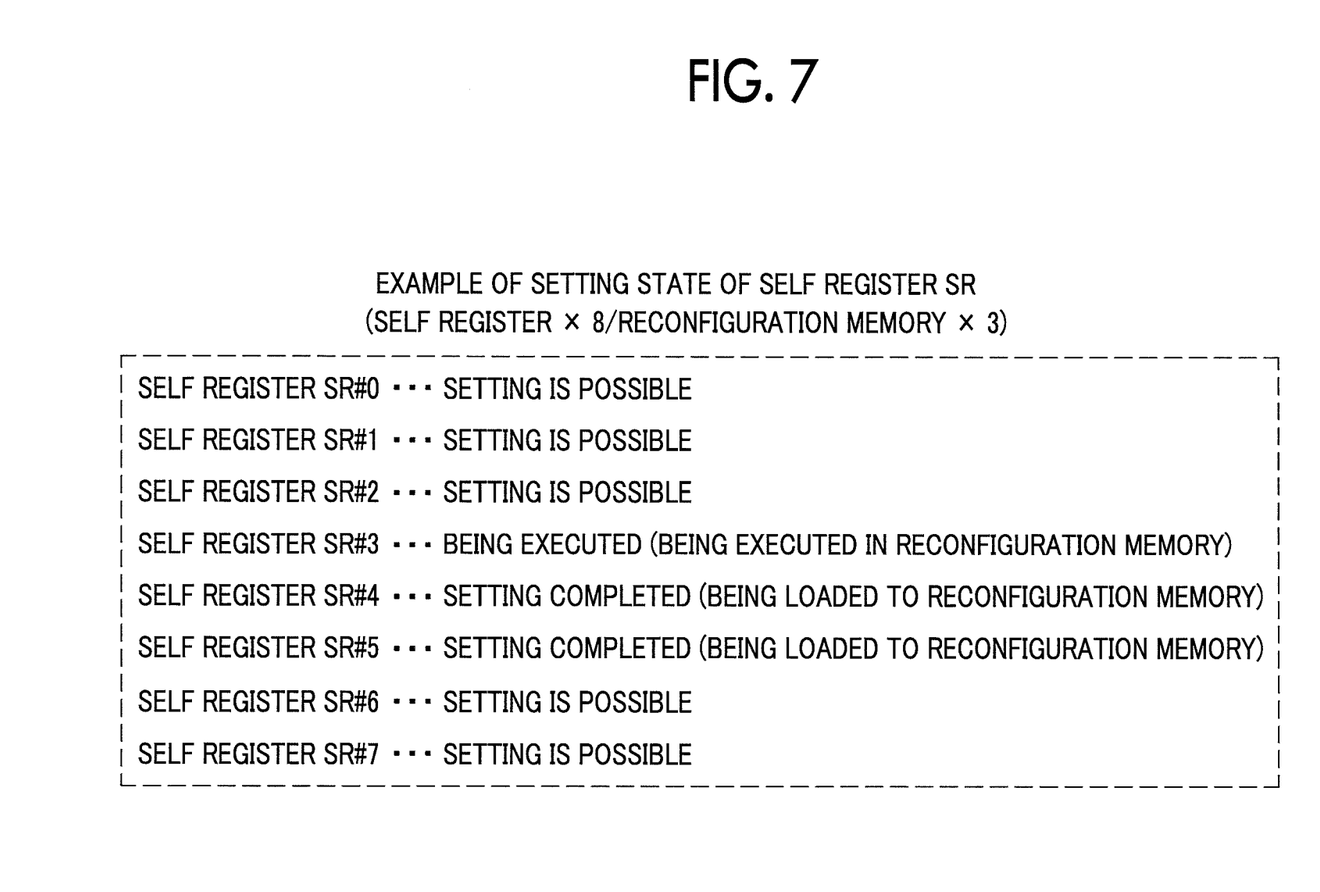
FIG. 7 is a diagram showing a specific example of a setting state of a self register.

FIG. 7 is a diagram showing a specific example of the setting state of the self register SR. In the specific example shown in FIG. 7, the number of the self registers SR is eight (SR#0 to SR#7), and the number of pieces of reconfiguration data capable of being loaded to the reconfiguration memory 20 is three.

In the specific example shown in FIG. 7, the self register SR#3 is currently being executed. That is, reconfiguration data corresponding to the loading information set in the self register SR#3 is loaded to the reconfiguration memory 20, and the reconfigurable circuit 10 is reconfigured with the reconfiguration data.

In addition, the setting of the self registers SR#4 and SR#5 is completed. That is, loading information is previously set in each of the self registers SR#4 and SR#5, and reconfiguration data corresponding to the loading information is being loaded (is being loaded or has been loaded) to the reconfiguration memory 20.

The setting of other self registers SR#0 to SR#2, SR#6, and SR#7 is possible. That is, no loading information is set or loading information used previously is set in each of the self registers SR#0 to SR#2, SR#6, and SR#7, and the setting of new loading information therein is possible.

In the setting state shown in FIG. 7, the number (#X) of a self register SR in which the setting is completed is #5 (X=5), and the number (#Y) of a self register SR that is currently being executed is #3 (Y=3).

When the data processing related to the reconfiguration data corresponding to the self register SR#3 is terminated, the reconfigurable circuit 10 is reconfigured with the reconfiguration data corresponding to the self register SR#4. The self register SR#4 becomes currently executed, and the setting of the self register SR#3 becomes possible. Furthermore, when the data processing related to the reconfiguration data corresponding to the self register SR#4 is terminated, the reconfigurable circuit 10 is reconfigured with the reconfiguration data corresponding to the self register SR#5. The self register SR#5 becomes currently executed, and the setting of the self register SR#4 becomes possible. In addition, new loading information is sequentially set in a self register SR in which the setting is possible. Accordingly, although the number of the self registers SR is limited (for example, to eight), self registers SR that may be reset after the use of the loading information may be cyclically used. Therefore, the reconfiguration may be continued plural times (without limitation in theory) without being limited by the number of the self registers SR.

Returning to FIG. 6, when confirming the setting state of the self register SR, the control processor 70 confirms whether there is a setting margin (S602). The setting margin is a numerical value that decides a safety factor C that is used later in the calculation of a prediction processing time A. For example, the number of self registers SR in which the setting is completed corresponds to the setting margin. For example, in the setting state shown in FIG. 7, the number of self registers SR in which the setting is completed is two, and the setting margin is two.

In S602 of FIG. 6, when the setting margin is confirmed and there is no setting margin (the setting margin is zero), the control processor 70 executes a setting process related to reconfiguration data #X+1 with respect to the self register SR (S603). When there is no setting margin, there is no self register SR#X in which the setting is completed. Thus, for example, the number #Y of a self register SR that is currently being executed is changed into #X, and the setting process related to the reconfiguration data #X+1 is executed for the next self register SR#X+1 (X=Y). The setting process related to the reconfiguration data #X+1 includes setting of loading information of the reconfiguration data #X+1 in the self register SR#X+1, setting of a parameter P#X+1 of the reconfiguration data #X+1, and setting of an interrupt mask #X+1 in an interrupt register IR#X+1.

When the setting process related to the reconfiguration data #X+1 is executed, the control processor 70 confirms whether an interrupt signal is output from the reconfigurable circuit 10 (S604). When the interrupt signal is output, that is, when the reconfigurable circuit 10 requests the reconfiguration, the setting process shown in FIG. 6 is terminated, and the process proceeds to S505 of FIG. 5 to release the mask related to the interrupt signal. Accordingly, the reconfiguration of the reconfigurable circuit 10 is permitted.

In S604 of FIG. 6, when the interrupt signal is not output, the control processor 70 predicts a processing time of the data processing that is currently being executed by the reconfigurable circuit 10 (S605). That is, the control processor 70 calculates a prediction processing time A based on the following expression.

Prediction Processing Time($clk$)=output data(byte)× circuit performance($clk$/byte)×safety factor $C$  Expression 1

The output data represents the size (byte) of data that is a target of the data process that is currently being executed, and the circuit performance represents a time (clk) for processing 1-byte data by the circuit that is currently executing the data processing.

The safety factor C is a factor set according to the setting margin, that is, the number of self registers SR in which the setting is completed. The larger the setting margin, the smaller the safety factor C, and a short prediction processing time A is estimated. Specifically, for example, when the setting margin is 4, the safety factor C is 0.6, when the setting margin is 3, the safety factor C is 0.7, when the setting margin is 2, the safety factor C is 0.8, when the setting margin is 1, the safety factor C is 0.9, and when the setting margin is 0, the safety factor C is 1.0.

When the safety factor C is used, for example, in a case in which the setting margin is relatively large, and thus the number of self registers SR in which the setting is completed is relatively large, the safety factor C is reduced, and thus a relatively short prediction processing time A is estimated, whereby a setting process (S610) related to reconfiguration data #X+i to be described later is not forcibly performed. In contrast, when the setting margin is relatively small, and thus the number of self registers SR in which the setting is completed is relatively small, the safety factor C is increased, and thus a relatively long prediction processing time A is estimated, whereby the setting process (S610) related to the reconfiguration data #X+i is performed as frequently as possible within the processing time of the data processing by the reconfigurable circuit 10.

When calculating the prediction processing time A, the control processor 70 predicts a remaining processing time based on the calculated prediction processing time A (S606). That is, the control processor 70 subtracts a setting time B (X+1) from the prediction processing time A to modify the prediction processing time A to a remaining processing time A. The setting time (X+1) is a time required for the setting related to the reconfiguration data #X+1 in S603.

Next, the control processor 70 increases the variable i by 1, and further predicts a remaining processing time (S608). That is, the control processor 70 subtracts a setting time B(X+i), that is, a setting time B(X+2) from the remaining processing time A obtained in S606 to modify the remaining processing time A. The setting time B(X+i) is a time required for the setting related to the reconfiguration data #X+i that will be set next time.

The control processor 70 determines whether to continue the setting process based on the remaining processing time A obtained in S608 (S609). When the value of the remaining processing time A obtained in S608 is a negative value (A<0), the control processor 70 determines that the setting process will not be continued, and when the value of the remaining processing time A obtained in S608 is not a negative value (A≥0), the control processor 70 determines that the setting process will be continued.

Regardless of the value of the remaining processing time A obtained in S608, the control processor 70 determines that the setting process will not be continued when the interrupt signal is output from the reconfigurable circuit 10, and even when there is no self register SR in which the setting is possible (that is, when X+i=Y), the control processor 70 determines that the setting process will not be continued. When the setting process is not continued, the setting process shown in FIG. 6 is terminated and the process proceeds to S505 of FIG. 5.

When the setting process is continued, the control processor 70 executes the setting process related to the reconfiguration data #X+i with respect to the self register SR (S610). The setting process related to the reconfiguration data #X+i includes setting of loading information of the reconfiguration data #X+i in the self register SR#X+i, setting of a parameter P#X+i of the reconfiguration data #X+i, and setting of an interrupt mask #X+i in an interrupt register IR#X+i.

Next, after increasing the variable i by 1, the control processor 70 returns to S608 to further predict a remaining processing time. That is, the control processor 70 subtracts a setting time B(X+i) from the remaining processing time A obtained in the previous S608 to modify the remaining processing time A. The setting time B(X+i) is a time required for the setting related to the reconfiguration data #X+i that will be set next time. Furthermore, the control processor 70 determines whether to continue the setting process in S609. Until determining that the setting process will not be continued in S609, the control processor 70 repeatedly executes the setting related to the reconfiguration data #X+i of S610 to perform the setting as many times as possible in relation to plural pieces of reconfiguration data within the processing time of the data processing that is currently being executed by the reconfigurable circuit 10.

Returning to S602, when the setting margin is confirmed and there is a setting margin (the setting margin is 1 or larger), the control processor 70 predicts a processing time of the data processing that is currently being executed by the reconfigurable circuit 10 (S607). That is, the control processor 70 calculates a prediction processing time A based on the Expression 1 used also in S605.

Furthermore, the control processor 70 predicts a remaining processing time based on the calculated prediction processing time A (S608). That is, the control processor 70 subtracts a setting time B (X+i) from the prediction processing time A to modify the prediction processing time A to a remaining processing time A. The setting time B (X+i) is a time required for the setting related to the reconfiguration data #X+i that will be set next time.

The control processor 70 executes processes after S609 described above. That is, in S609, until determining that the setting process will not be continued, the control processor 70 repeatedly executes the setting related to the reconfiguration data #X+i of S610 to perform the setting as many times as possible in relation to plural pieces of reconfiguration data within the processing time of the data processing that is currently being executed by the reconfigurable circuit 10.

Returning to FIG. 5, when the setting process (see FIG. 6) in S504 is terminated, the control processor 70 releases the interrupt mask related to the data processing that is currently being executed by the reconfigurable circuit 10 (S505). Accordingly, when the reconfiguration of the reconfigurable circuit 10 is permitted and an interrupt signal is output from the reconfigurable circuit 10, the autonomous reconfiguration controller 50 reconfigures the circuit configuration part of the reconfigurable circuit 10, and thus a state in which the next data processing is possible is obtained.

The control processor 70 confirms whether data processing for final data of the processing target data is completed (S506). When the data processing is not completed, the control processor 70 executes the processes after S503 again. When the data processing for the final data of the processing target data is completed, the control process shown in FIG. 5 is terminated.

Figure 8:
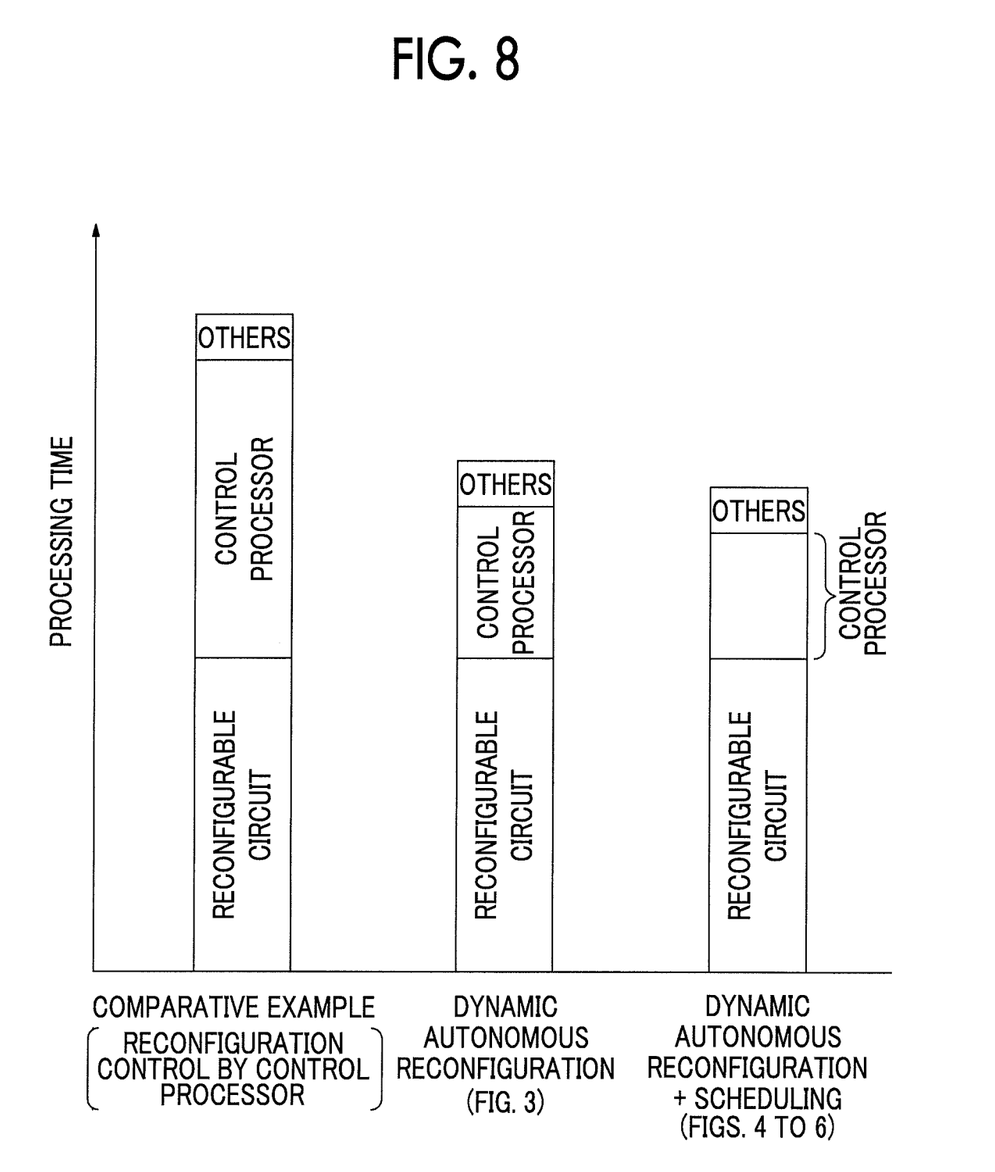
FIG. 8 is a diagram showing comparison results related to data processing time.

FIG. 8 is a diagram showing comparison results related to the data processing time. FIG. 8 illustrates a graph of simulation results related to the processing time when dynamic autonomous reconfiguration (see FIG. 3) is performed in the present data processing apparatus and illustrates a graph of simulation results related to the processing time when dynamic autonomous reconfiguration (see FIGS. 4 to 6) with scheduling is performed.

As a comparative example, a graph of measured values related to the processing time when reconfiguration control by the control processor is performed without performing dynamic autonomous reconfiguration is provided. The reconfiguration control by the control processor is control for performing the reconfiguration data loading and the reconfiguration of the reconfigurable circuit 10 by the control processor 70 without using neither the self loader 40 nor the autonomous reconfiguration controller 50.

In each graph, "reconfigurable circuit" represents a processing time of the reconfigurable circuit 10, "control processor" represents a processing time of the control processor 70, and "others" represents a time for processes other than the processes of the reconfigurable circuit 10 and the control processor 70. In each graph, the sum of "reconfigurable circuit", "control processor", and "others" is a total processing time.

Processing target data and data processing are common to all of the three graphs respectively corresponding to the comparative example, the dynamic autonomous reconfiguration, and the dynamic autonomous reconfiguration with scheduling. Accordingly, the processing time (actual operation time) of the reconfigurable circuit 10 is the same in the three graphs.

Regarding the processing time of the control processor 70, marked differences are shown in the three graphs. That is, in the reconfiguration control by the control processor, the control processor 70 performs a reconfiguration process every when the circuit configuration of the reconfigurable circuit 10 is changed, whereby the processing time of the control processor 70 is relatively long.

In the dynamic autonomous reconfiguration, the autonomous reconfiguration controller 50 performs a reconfiguration process, and thus the processing time of the control processor 70 is greatly reduced (reduced substantially by half in the example of FIG. 8), compared to the reconfiguration control by the control processor.

In the dynamic autonomous reconfiguration, it is necessary to perform setting of the self register SR, change of the parameter P, and setting of the interrupt register IR. However, a time for both of the setting of the self register SR and the setting of the interrupt register IR is just 1 microsecond (µs) or shorter, and a time for the change of the parameter P is approximately 10 µs, whereby these are extremely shorter than the total processing time (for example, several tens of seconds). Particularly, in the dynamic autonomous reconfiguration with scheduling, since setting of the self register and the like (setting of the self register SR, change of the parameter P, and setting of the interrupt register IR) are performed within the processing time of the reconfigurable circuit 10, an increase in the processing time associated with the setting of the self register and the like is suppressed, and the total processing time is further shortened.

The appropriate exemplary embodiments of the invention have been described as above. However, the above-described exemplary embodiments are just examples in all respects, and the scope of the invention is not limited thereto. The invention includes various modifications without departing from the gist of the invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A data processing apparatus comprising:
   a reconfigurable circuit that has a dynamically-reconfigurable circuit configuration to execute data processing with the reconfigured circuit configuration;
   a loading processor that loads reconfiguration data to a reconfiguration memory based on set loading information;
   a reconfiguration processor that reconfigures the circuit configuration with the reconfiguration data loaded to the reconfiguration memory in response to a request from the reconfigurable circuit; and
   a controller that executes a setting process of setting the loading information with respect to the loading processor while inhibiting the reconfiguration by inhibiting the request, and un-inhibits the request after terminating the setting process to permit the reconfiguration.

2. The data processing apparatus according to claim 1, wherein
   the controller predicts a processing time of the data processing that is executed by the reconfigurable circuit in the setting process, and determines whether the completion of the setting of the loading information with respect to the loading processor is possible within the predicted processing time of the data processing, to set the loading information in the loading processor when determining that the completion is possible.

3. The data processing apparatus according to claim 2, wherein
   after setting the loading information, the controller further determines whether the completion of the setting of next loading information is possible within the predicted processing time of the data processing, to set the next loading information in the loading processor when determining that the completion is possible.

4. The data processing apparatus according to claim 1, wherein
   the controller predicts a processing time of the data processing that is executed by the reconfigurable circuit in the setting process, and determines whether the completion of the setting of the loading information with respect to the loading processor is possible within the predicted processing time of the data processing, to terminate the setting process without setting the loading information in the loading processor when determining that the completion is not possible, and to un-inhibit the request from the reconfigurable circuit to thus permit the reconfiguration.

5. The data processing apparatus according to claim 2, wherein
   the controller predicts a processing time of the data processing that is executed by the reconfigurable circuit in the setting process, and determines whether the completion of the setting of the loading information with respect to the loading processor is possible within the predicted processing time of the data processing, to terminate the setting process without setting the loading information in the loading processor when determining that the completion is not possible, and to un-inhibit the request from the reconfigurable circuit to thus permit the reconfiguration.

6. The data processing apparatus according to claim 3, wherein
   the controller predicts a processing time of the data processing that is executed by the reconfigurable circuit in the setting process, and determines whether the completion of the setting of the loading information with respect to the loading processor is possible within the predicted processing time of the data processing, to terminate the setting process without setting the loading information in the loading processor when determining that the completion is not possible, and to un-inhibit the request from the reconfigurable circuit to thus permit the reconfiguration.

7. A data processing method related to control of a dynamic reconfiguration apparatus including a reconfigurable circuit that has a dynamically-reconfigurable circuit configuration, a loader that loads reconfiguration data to a reconfiguration memory based on loading information, and a reconfiguration controller that reconfigures the circuit configuration with the reconfiguration data loaded to the reconfiguration memory in response to a request from the reconfigurable circuit,
   the method comprising:
   executing a setting process of setting the loading information with respect to the loader while inhibiting the reconfiguration by the reconfiguration controller by inhibiting the request from the reconfigurable circuit; and
   un-inhibiting the request after terminating the setting process to permit the reconfiguration.

8. A non-transitory computer readable medium storing a program causing a computer to execute a process for a data processing method related to control of a dynamic reconfiguration apparatus including a reconfigurable circuit that has a dynamically-reconfigurable circuit configuration, a loader that loads reconfiguration data to a reconfiguration memory based on loading information, and a reconfiguration controller that reconfigures the circuit configuration with the reconfiguration data loaded to the reconfiguration memory in response to a request from the reconfigurable circuit,
   the process comprising:
   executing a setting process of setting the loading information with respect to the loader while inhibiting the reconfiguration by the reconfiguration controller by inhibiting the request from the reconfigurable circuit; and
   un-inhibiting the request after terminating the setting process to permit the reconfiguration.

9. The data processing apparatus according to claim 1, wherein
the controller inhibits the request from the reconfigurable circuit in response to the setting process being concurrently executed, and un-inhibits the request to thereby permit the reconfiguration in response to the setting process being terminated.

10. The data processing method according to claim 7, wherein
the request from the reconfigurable circuit is inhibited in response to the setting process being concurrently executed, and the request is un-inhibited to thereby permit the reconfiguration in response to the setting process being terminated.

11. The non-transitory computer readable medium according to claim 8, wherein
the request from the reconfigurable circuit is inhibited in response to the setting process being concurrently executed, and the request is un-inhibited to thereby permit the reconfiguration in response to the setting process being terminated.

* * * * *